(12) United States Patent
Buer et al.

(10) Patent No.: US 7,535,320 B2
(45) Date of Patent: May 19, 2009

(54) PHASE SHIFTER WITH FLEXIBLE CONTROL VOLTAGE

(75) Inventors: Kenneth V Buer, Gilbert, AZ (US); Chris Grondahl, Gilbert, AZ (US)

(73) Assignee: U.S. Monolithics, L.L.C., Chandler, AZ (US)

( * ) Notice: Subject to any disclaimer, the term of this patent is extended or adjusted under 35 U.S.C. 154(b) by 0 days.

(21) Appl. No.: 11/160,845

(22) Filed: Jul. 12, 2005

(65) Prior Publication Data

US 2007/0013460 A1 Jan. 18, 2007

(51) Int. Cl.
*H01P 1/18* (2006.01)

(52) U.S. Cl. .................. 333/164; 333/139; 333/103

(58) Field of Classification Search ............ 333/139, 333/156, 161, 164, 103, 104
See application file for complete search history.

(56) References Cited

U.S. PATENT DOCUMENTS

| | | | |
|---|---|---|---|
| 4,011,566 A | 3/1977 | Honda | |
| 4,121,221 A | 10/1978 | Meadows | |
| 4,123,759 A | 10/1978 | Hines et al. | |
| 4,635,062 A * | 1/1987 | Bierig et al. | 342/372 |
| 4,810,911 A * | 3/1989 | Noguchi | 327/431 |
| 4,872,211 A | 10/1989 | Chen | |
| 5,092,783 A | 3/1992 | Suarez et al. | |
| 5,311,156 A | 5/1994 | Andoh | |
| 5,339,083 A | 8/1994 | Inami | |
| 5,519,349 A * | 5/1996 | Nakahara | 327/237 |
| 5,767,721 A * | 6/1998 | Crampton | 327/308 |
| 5,886,671 A | 3/1999 | Riemer et al. | |
| 5,923,289 A | 7/1999 | Buer et al. | |
| 5,945,897 A | 8/1999 | Pluymers et al. | |
| 5,990,580 A | 11/1999 | Weigand | |
| 6,031,188 A | 2/2000 | Pluymers et al. | |
| 6,102,709 A | 8/2000 | Howard et al. | |
| 6,166,615 A | 12/2000 | Winslow et al. | |
| 6,320,413 B1 | 11/2001 | Kurisu | |
| 6,411,523 B1 | 6/2002 | Roberson et al. | |
| 6,606,073 B1 | 8/2003 | Visser | |

(Continued)

OTHER PUBLICATIONS

Liam Devlin, The Design of Integrated Switches and Phase Shifters, Paper presented at the "The IEE Colloquium on The Design of RFICs and MMICs" held at Savoy Place, London on Wednesday, Nov. 24, 1999.

(Continued)

*Primary Examiner*—Benny Lee
(74) *Attorney, Agent, or Firm*—Snell & Wilmer L.L.P.

(57) ABSTRACT

The invention provides a phase shifter with flexible control voltage that is useful with all RF systems that phase shift a RF signal. The phase shifter according to the present invention may comprise transistors used as switching elements. In one aspect, the phase shifter provides the option of controlling a phase shifter with either a positive or a negative voltage control signal. For example, the dc ground of the transistors included in the phase shifter may be floated i.e. fixed or adjusted. The RF grounding of the transistors may be achieved by in-band resonant capacitors. Thus, the control voltage provided to the transistors is flexible in that it may be connected to a positive or negative control voltage, or it may be connected to ground, or it may swing from a positive control voltage to a negative control voltage or vice versa.

5 Claims, 6 Drawing Sheets

U.S. PATENT DOCUMENTS

| | | |
|---|---|---|
| 6,667,670 B2 | 12/2003 | Hong et al. |
| 6,693,498 B1 | 2/2004 | Sasabata et al. |
| 6,731,513 B2 | 5/2004 | Rodgers et al. |
| 2002/0030552 A1 | 3/2002 | Hong et al. |
| 2004/0145429 A1 | 7/2004 | Hieda et al. |
| 2005/0270119 A1* | 12/2005 | Fukumoto et al. ........... 333/104 |

OTHER PUBLICATIONS

Rhodes M: "Monolithic phase shifter for S-Band inter-satellite data relay antenna", IEE Colloquium on Recent Advances in Microwave Sub-Systems for Space and Satellite Applications; Mar. 18, 1993; 6 pgs.

Devlin L: "The design of integrated switches and phase shifters", IEE Tutorial Colloquium: Design of RFICS and MMICS; Nov. 24, 1999; 14 pgs.

Kusunoki S et al.: "SPD switch MMIC using E/D-mode GaAz JFETs for personal communications"; GAAS IC Symposium, Miami Beach; Oct. 4, 1992; 4 pgs.

International Search Report dated Aug. 14, 2006.

* cited by examiner

PHASE SHIFTER WITH FLEXIBLE CONTROL VOLTAGE

FIELD THE INVENTION

The invention relates to a system and method for a phase shifter and more particularly, for a phase shifter with flexible control voltage.

BACKGROUND OF THE INVENTION

Phase shifter circuits allow control of insertion phase of a network. They find application in electronic circuitry, such as for example, for shifting the phase of signals propagating on a transmission line. One application in which phase shifters are commonly found is in phased-array and active-array antenna arrangements using transmit-receive (T/R) modules. In general T/R modules include phase shifters for receiving phase shift data and for forming antennae beam patterns and varying the phase of a RF signal.

Figure 1:
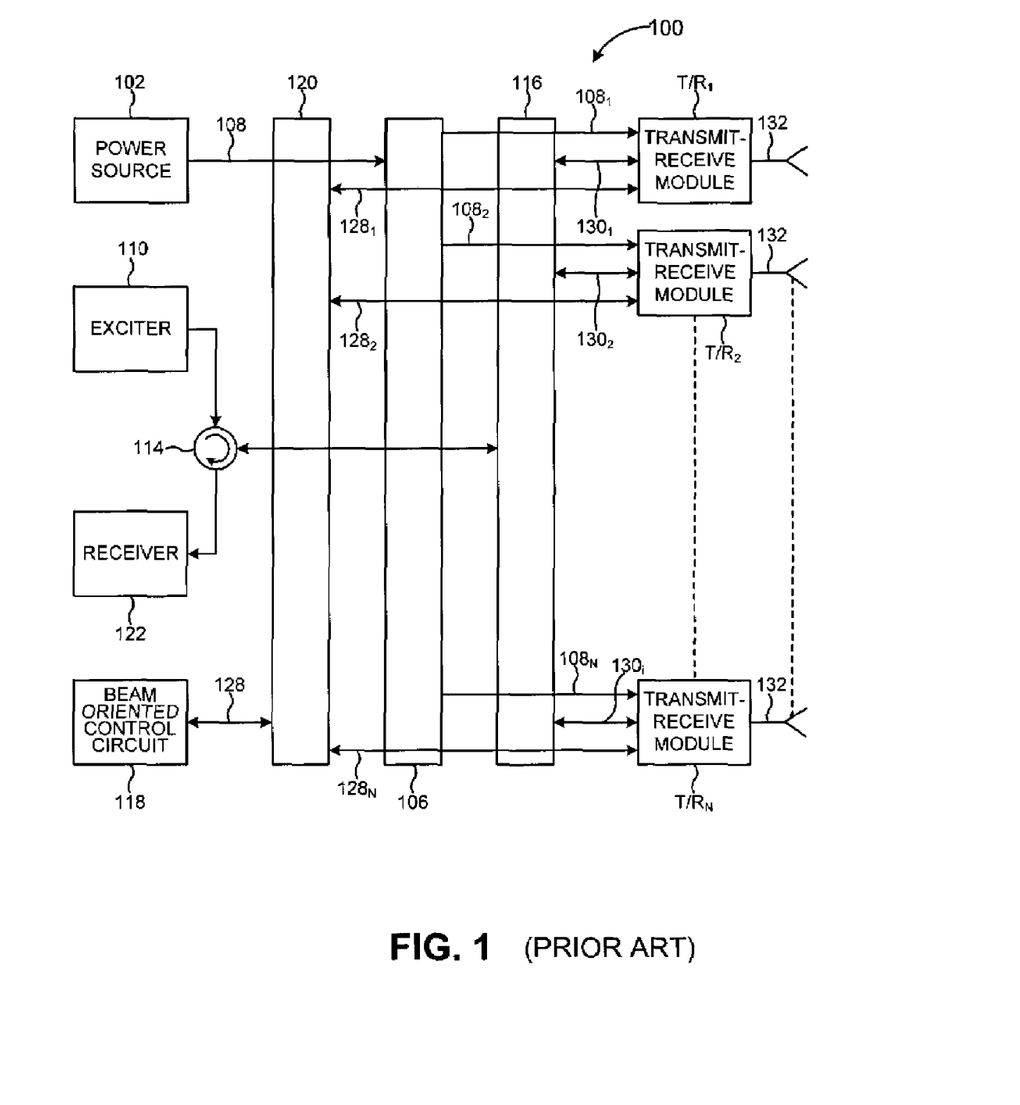
FIG. 1 is a depiction of an exemplary prior art phased array radar.
Figure 2:
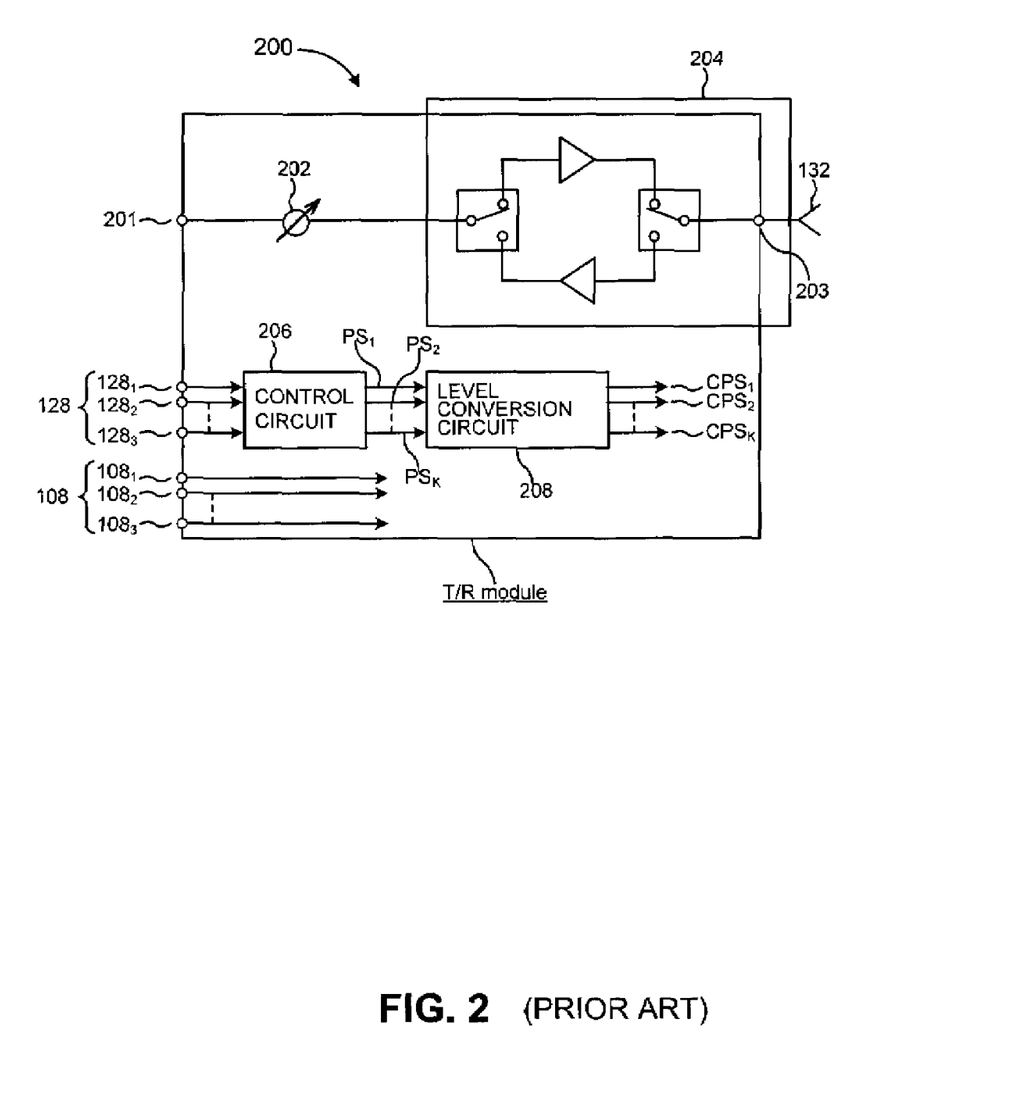
FIG. 2 is a depiction of an exemplary prior art transmit/receive module.

FIGS. 1 and 2 depict traditional phase shifter equipment. Specifically, FIG. 1 is a block diagram of a conventional phased array radar 100 commonly found in the art. As shown in FIGS. 1 and 2, phased array radar 100 includes a power source 102 for supplying a predetermined supply voltage 108 to a plurality of T/P modules $T/R_1, T/R_2, \ldots T/R_N$. A supply voltage feed circuit 106 distributes supply voltage $108_1, 108_2, 108_3, \ldots 108_N$ to the T/R modules $T/R_1, T/R_2, \ldots T/R_N$. Phased array radar 100 additionally includes an exciter 110 for generating RF signals that are fed to a RF signal circulator 114. RF signal circulator 114 is typically configured to provide the RF signals generated by the exciter 110, or RF signals received at a receiver 122, to the T/R modules $T/R_1, T/R_2, \ldots T/R_N$ using a signal synthesizing and distribution circuit 116. Particularly, synthesizing and distribution circuit 116 receives the RF signals from circulator 114 and distributes RF signals $130_1, 130_2, \ldots 130_i$ to antennae 132 via T/R modules $T/R_1, T/R_2, \ldots T/R_N$. A control circuit 118 provides control signals 128 to the T/R modules $T/R_1, T/R_2, \ldots T/R_N$ via a control signal distribution circuit 120. Control signal distribution circuit 120 receives control signal $128_1, 128_2, \ldots 128_N$ 128 from control circuit 118 and provides control signals $128_1, 128_2, \ldots 128_N$ to T/R modules $T/R_1, T/R_2, \ldots T/R_N$.

FIG. 2 illustrates a conventional T/R module 200 that may be used, for example, as any one of T/R modules $T/R_1, T/R_2, \ldots T/R_N$. T/R module 200 may include an input/output node 201 for transmitting a RF signal between the RF signal synthesizing and distribution circuit 116 (FIG. 1) and a phase shifter 202 and an input/output node 203 for transmitting a RF signal between an antenna 132 and an amplifier circuit 204. Phase shifter 202 and amplifier circuit 204 may be in communication for transmitting a RF signal therebetween. Moreover, it should be noted that any like numerous shown also in FIG. 1 are discussed above according to this exemplary embodiment of the present invention.

To facilitate understanding of the invention certain naming convention has been adopted. For example, as used herein, a RF signal received from synthesizing and distribution circuit 116 is called a "synthesized RF signal $130_{1-i}$." A RF signal received from phase shifter 202 and provided to amplifier circuit 204 is called a "transmission RF signal." A RF signal received from free space via antenna 132 and provided to amplifier circuit 204 for providing to phase shifter 202, is called a "received RF signal."

As noted, phase shifter 202 is configured to shift the phase of transmission RF signals according to phase shift data. Amplifier circuit 204 is typically configured to amplify the transmission RF signal up to a predetermined level prior to providing the transmission RF signal to antenna 132, and to amplify received RF signals at a low noise.

A control circuit 206 for receiving a control signal $128_1, 128_2, \ldots 128_3$ from control signal distribution circuit 120 (FIG. 1) outputs a plurality of predetermined phase setting signals (e.g. phase shift data $PS_1, PS_2, \ldots PS_K$) to a level conversion circuit 208. Level conversion circuit 208 typically receives the phase shift data $PS_1, PS_2, \ldots PS_K$ from control circuit 206 and converts the phase shift data $PS_1, PS_2, \ldots PS_K$ to an output voltage (e.g., converted phase shift data $CPS_1, CPS_2, \ldots CPS_K$) useful for driving the phase shifter 202.

Control circuit 206 is configured to output predetermined phase setting signals $PS_1, PS_2, \ldots PS_K$ in accordance with control signals $128_1, 128_2, \ldots 128_3$. Phase shifter 202 uses the phase setting signals $PS_1, PS_2, \ldots PS_K$ in forming antenna beam patterns.

Notably, conventional phase shifters include a number of transistors that receive the phase setting signals $PS_1, PS_2, \ldots PS_K$ to enable transistor operation and signal phase shifting. Thus, the phase setting signals $PS_1 PS_2, \ldots PS_K$ must be at a voltage level predetermined by the type of transistor used to enable transistor operation. For this purpose, phase shifter 200 may use a level conversion circuit 208 to convert phase setting signals $PS_1, PS_2, \ldots PS_K$ to the voltage level required for transistor operation. The converted phase setting signals $PS_1, PS_2 \ldots PS_K$ (shown as $CPS_1, CPS_2, \ldots CPS_K$) may then be applied to the phase shifter 202 transistors as described below.

Figure 3:
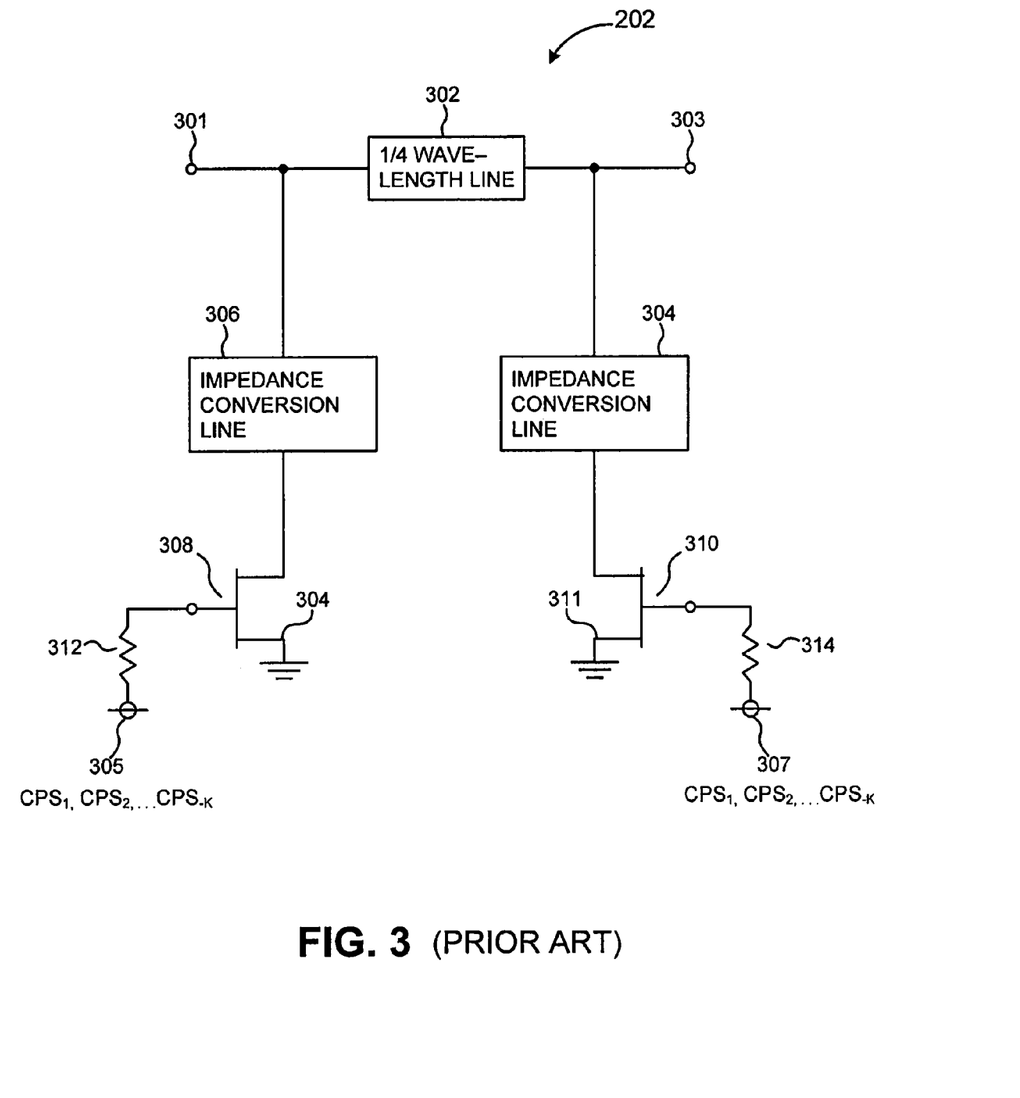
FIG. 3 is a schematic representation of a prior art phase shifter.

FIG. 3 depicts an exemplary schematic of a conventional phase shifter 202 useful with T/R module 200. Phase shifter 202 includes RF input/output terminals 301, 303 that are placed in communication one with the other using a ¼ wavelength transmission line 302. RF input/output terminal 301 may be in communication with an impedance conversion line 306, and RF input/output terminal 303 may be in communication with an impedance conversion line 304, where impedance conversion lines 304, 306 are useful for converting the input impedances of any later connected transistor elements into impedances for obtaining a desired phase shift. The transistors used in the phase shifter 202 are field effect transistors (FET) 308, 310 having their gates in communication with the level conversion circuit 208 (FIG. 2) for receiving converted phase setting signals $CPS_1, CPS_2, \ldots CPS_K$ used to turn FETs 308, 310 on and off. FETs 308, 310 have their dc reference terminal 304, 311 placed at ground potential. Converted phase setting signals $CPS_1, CPS_2, \ldots CPS_K$ may be biased by bias resistances 312, 314 and applied to the gate of FETs 308, 310 at gate terminals 305, 307 to enable proper FET 308, 310 operation.

One limitation placed on conventional phase shifter design is that gate terminals 305, 307 may only be driven by a voltage polarity consistent with the type of transistor included in the phase shifter 202. For example, for an N-type FET 308, 310 the gate terminal 305, 307 can only be driven with a negative voltage to control FET 308, 310 operation. Thus, converted phase setting signals $CPS_1, CPS_2, \ldots CPS_K$ must have a negative polarity when applied to gate terminal 305, 307.

However, in some instances, it is desirable to provide the control signals received from control circuit 206 to T/R module circuit elements requiring a positive voltage polarity. For example, where the amplifier circuit 204 is comprised of transistors (not shown) requiring a positive voltage, it is necessary to convert the negative control voltages received from, for example, level conversion circuit 208 (e.g. $CPS_1, CPS_2, \ldots CPS_K$) to voltages having a positive potential. To address this problem, prior art phased-array antenna systems ordinarily used a logic inverter to reverse the polarity of the signal provided by the level conversion circuit. U.S. Pat. No. 6,320,413 discloses exemplary prior art systems and methods for conventional level conversion circuit operable to change the polarity of the control voltages provided by, for example, control circuit 206.

One drawback with the use of logic inverters to change the polarity of the control signals is that the size and power consumption of the T/R module is increased. When overall size and power consumption is a circuit design consideration, such as when the antenna array requires plurality T/R modules operating at high frequencies, it may be desirable to find ways to reduce the number of circuit elements included in the T/R module.

SUMMARY OF THE INVENTION

The present invention addresses problems inherent in the prior art, by providing a phase shifter with a flexible control voltage. Contrary to prior art phase shifters which require either a positive or a negative control voltage for transistor operation, but typically not both, the phase shifter of the present invention may be driven with control signals having either a positive or negative control voltage. The phase shifter according to the present invention permits the control signals received by the phase shifter from a control circuit to be any polarity (negative or positive) eliminating the need for a logic inverter. That is, the phase shifter operation is not dependent upon the polarity of the control signal received.

In one aspect, the phase shifter of the present invention is constructed with transistors used as switches. Unlike conventional phase shifters which set the transistor dc reference voltage to ground, the RF grounding of the transistors used in the present invention is achieved by in-band resonant capacitors. The dc grounds of the transistors are floated and the transistors' dc reference voltage is connected to any desired voltage. The dc reference voltage may be set positive, negative, or set to ground, therefore, the control voltage provided to the transistors is flexible in that it may be connected to a positive or negative control voltage, or it may be connected to ground, or it may swing from a positive control voltage to a negative control voltage, or from a negative control voltage to a positive control voltage. The control voltage provided to the phase shifter is additionally flexible in that the control voltage may switch between a first voltage level $V_1$ and a second voltage level $V_2$. More particularly, the control voltage level may change from the first voltage level $V_1$ to the second voltage level $V_2$, and the change in voltage levels $\Delta V$ may have a suitable magnitude to ensure proper transistor operation. As such, the change in voltage levels may be chosen according to the requirements of transistors used. Consequently, the present invention eliminates the need for a logic inverter as is found in prior art phase shifters.

BRIEF DESCRIPTION OF THE DRAWINGS

The accompanying drawings, wherein like numerals depict like elements, illustrate exemplary embodiments of the present invention, and together with the description, serve to explain the principles of the invention. In the drawings.

DETAILED DESCRIPTION OF THE PREFERRED EMBODIMENTS

The invention provides a phase shifter with flexible control voltage that is useful with all RF systems requiring a phase shifting at a RF signal. The phase shifter according to the present invention comprises transistors used as switching elements. The phase shifter may be assembled using discrete elements or constructed using a semi-conductor chip such as a Monolithic Microwave Integrated Circuit or "MMIC". As such, one versed in the art understands that the phase shifter is not limited to the embodiment depicted and that the embodiment described is done to facilitate understanding of the invention.

Figure 4:
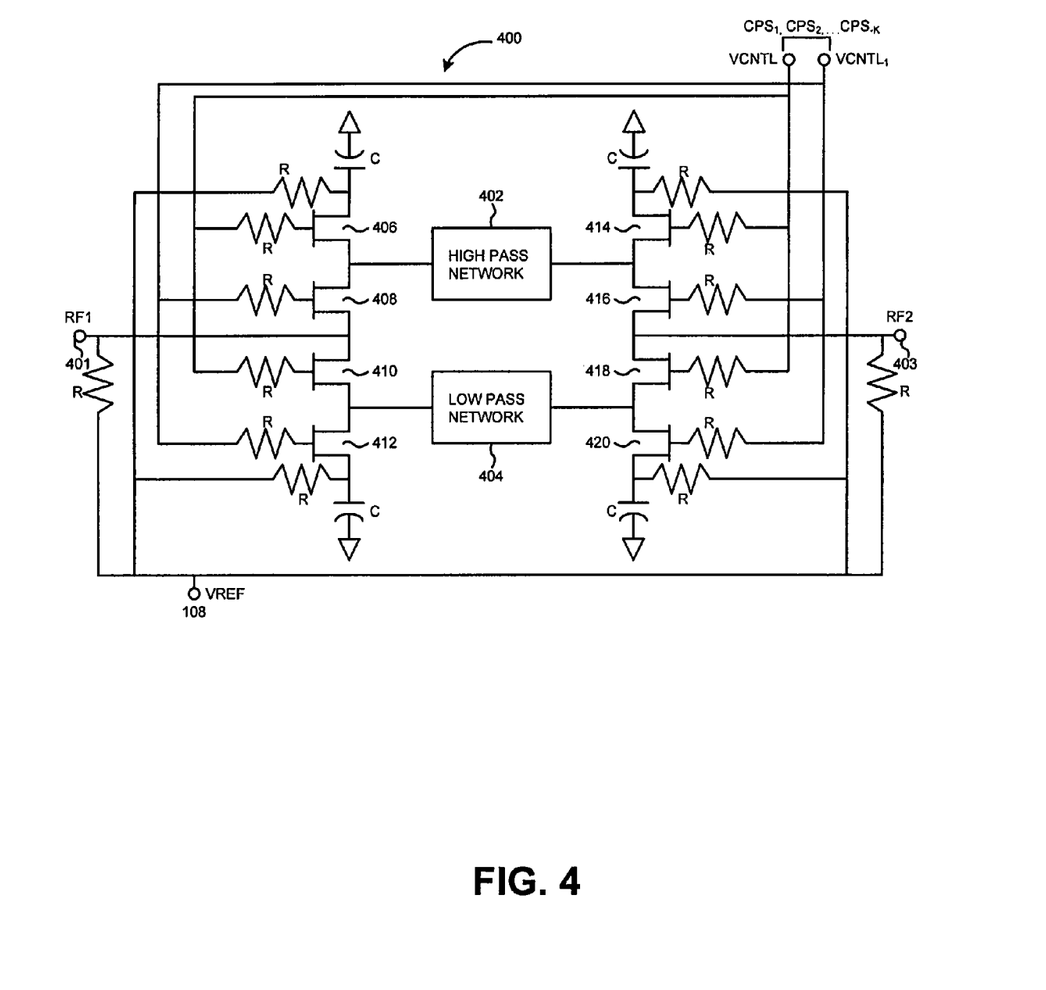
FIG. 4 is a depiction of an exemplary eight transistor phase shifter in accordance with the present invention.
Figure 5:
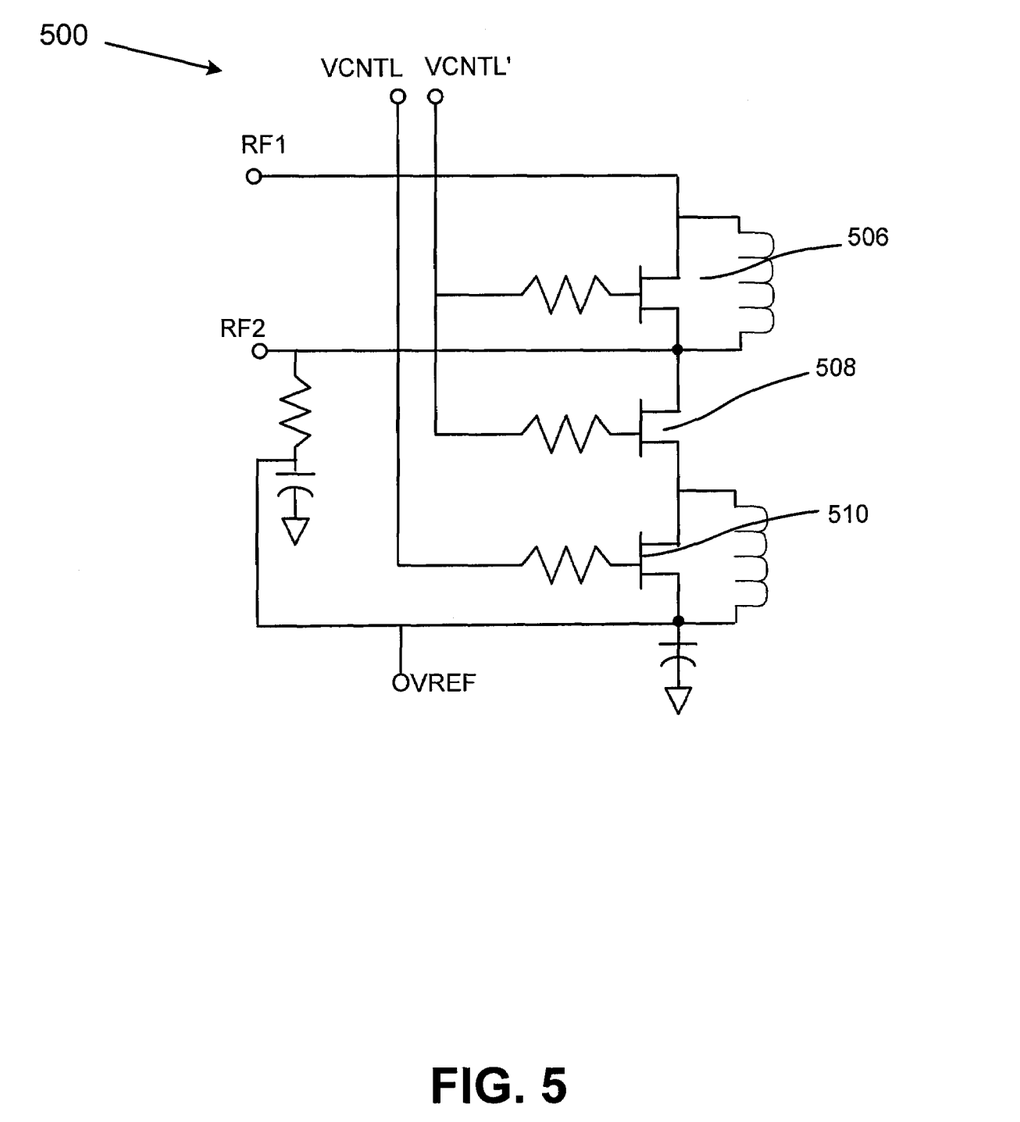
FIG. 5 is a depiction of an exemplary three transistors phase shifter in accordance with the present invention.
Figure 6:
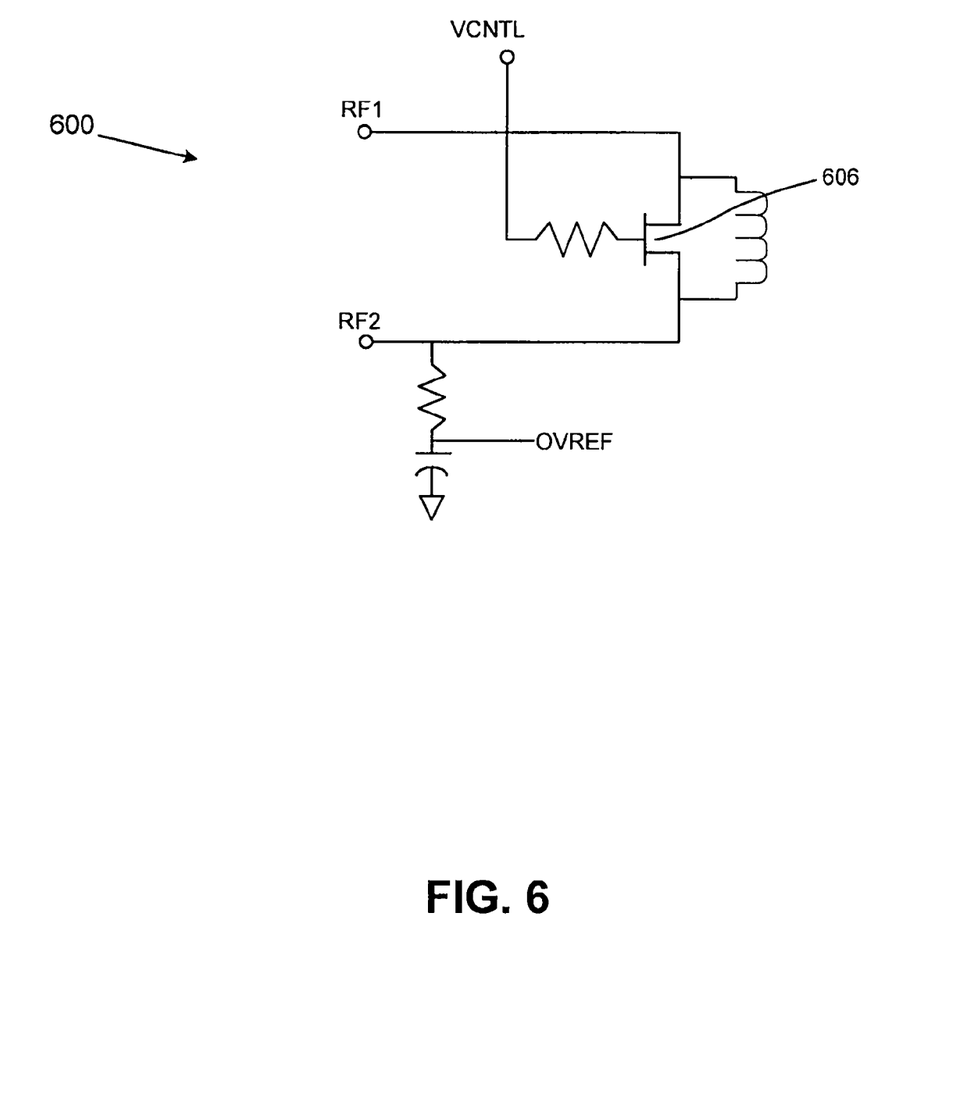
FIG. 6 is a depiction of an exemplary one transistor phase shifter in accordance with the present invention.

Indeed, the phase shifter described represents a 1 bit phase shifter. A conventional phase shifter network comprises several bits. As such, the phase shifter topology of the present invention may be one of the several bits of a phase shifter network. Other bits in the phase shifter network may have a different topology than the topology described herein. FIGS. 4 through 6 illustrate three examples of phase shifter bit topologies. The topologies in FIGS. 4 through 6 illustrate that a phase bit may have different numbers of transistors. FIG. 4 illustrates a phase bit with 8 transistors forming two SPDT switches. FIG. 5 shows a phase bit with 3 transistors. FIG. 6 shows a phase bit with only one transistor. The topologies in FIGS. 5 and 6 do not use SPDT switches. Higher order phase bits usually include more transistors than do lower order phase bits. FIG. 4 with 8 transistors is a typical topology for higher order bits. FIGS. 5 and 6 are typical of lower order bits. The inventive concepts of the phase shifter described below applies to all phase shifter networks regardless of the topology used.

With reference to FIG. 4, an exemplary embodiment of the phase shifter 400 with flexible control voltage according to the present invention is illustrated. Phase shifter 400 may be useful in T/R module 200 in place of phase shifter 202 previously described in FIG. 2. As shown, phase shifter 400 comprises two single pole double throw switches (SPDT) comprised of Field Effect Transistors (FET). The SPDT switches may route a RF signal to either the low pass network 404 or the high pass network 402. The RF signal may be provided to the phase shifter 400 from the RF signal synthesizing and distribution circuit 116 (FIG. 1) to input node 401 or the amplifier circuit 204 (FIG. 2) at node 403. In this way the phase shifter 400 shown is bi-directional. FIG. 4 also depicts the use of predetermined supply voltage 108 in this exemplary embodiment of the present invention.

Notably, although the present invention is described with respect to FETs and SPDT switches, the invention is not so limited. The invention contemplates a phase shifter with variable control voltage that is comprised of any transistor construction or transistor arrangement where the dc voltage to the transistor is floated. For example, the dc voltage may be floated by a capacitor as is described below.

As noted, the phase shifter 400 may be constructed using FETs 406, 408, 410, 412, 414, 416, 418 and 420, wherein FETs 406, 408, 410 and 412 comprise a first SPDT switch and FETs 414, 416, 418, 420 comprise a second SPDT switch. FETs 406, 408, 410 and 412 may be substantially similar in construction and FETs 414, 416, 418, 420 may be substantially similar in construction. Moreover, FETs 406, 408, 410, 412, 414, 416, 418 and 420 may be depletion mode FETs, which are selected in accordance with required insertion loss and isolation. Further still, FETs 406, 408, 410, 412, 414, 416, 418 and 420 maybe any transistors capable of use as a switch.

The first SPDT switch is fed with a first control voltage VCNTL at transistor 406 and 410, and the second SPDT switch is provided the VCNTL to subscribe transistor 414 and 418 for receiving, for example, one of converted phase shifter signals $CPS_1$, $CPS_2$, ... $CPS_K$. The second SPDT switch is provided with a control voltage $VCNTL_1$ at transistor 416 and 420 and the first SPDT switch is provided the $VCNTL_1$ at transistor 408 and 412 for receiving, for example, at least one of converted phase shifter signals $CPS_1$, $CPS_2$, ... $CPS_K$.

A reference voltage VREF is provided to the first SPDT switch at the source of transistor 406, at the source of transistor 412, at the drain of transistor 408, and at the drain of transistor 410. Similarly, reference voltage VREF is provided to the second SPDT switch at the source of transistor 414, at the source of transistor 420, at the drain of transistor 416, and at the drain of transistor 418.

VREF, VCNTL and $VCNTL_1$ are provided to the first and second SPDT switches through resistors R. In this aspect of the invention, resistors R isolate the RF signals provided at nodes 401 and 403 from the VREF and control voltages VCNTL and $VCNTL_1$. Similarly, the RF signals (RF 1, RF2), respectively provided at nodes 401 and 403 are connected to VREF through resistors R, which insures that VREF is applied to the drain terminals at FETs 408, 410, 416 and 418 so that the FETs in series with the RF path within the first and second SPDT switch properly.

Capacitor C is a series resonant capacitor (for example, an in-band resonant capacitor) that provides a low impedance RF path to ground so that RF performance of the phase shifter 400 is not degraded. The values of capacitors C are chosen according to values needed to achieve series resonance to ground at the design frequency. The values of resistors R are chosen according to values needed to achieve adequate isolation between the RF signal and the dc signals. If there is not enough isolation between the RF signal and the dc signals then the RF performance can be degraded. Although the invention is not so limited, an exemplary R value may be approximately between 1 to 2 kΩ.

A high pass network 402 is connected to the first SPDT switch at the common node between FET 406 and FET 408 and to the second SPDT switch at the common node between FET 414 and FET 416. A low pass network 404 is connected to the first SPDT switch at the common node between FET 410 and FET 412 and to the second SPDT switch at the common node between FET 418 and FET 420. As such, when a RF signal (RF1) is injected into phase shifter 400 at node 401 (or alternatively, RF signal (RF2) at node 403) the SPDT switches route the RF signal through the low pass network 404 or high pass network 402. The difference in phase shifting of the low pass network 404 and the high pass network 402 leads to a phase shifting of the RF signal as desired. Consequently, the configuration of the low pass network 404 and the high pass network 402 are chosen according to the amount of phase shift desired for the phase shifter bit and the matching impedance of the phase shifter bit.

During exemplary operation a RF signal is provided to node 401. In one of the two possible phase states the RF signal is routed through the high pass network 402. The first SPDT switch is set to have low loss between node 401 and the high pass network 402 and to have high isolation between node 401 and the low pass network 404. The second SPDT switch is set to have low loss between the high pass network 402 and node 403 and have high isolation between the low pass network 404 and node 403. This switch condition is established by turning on FET 408, FET 412, FET 416 and FET 420 and turning off FET 406, FET 410, FET 414 and FET 418. These FETs are turned on and off by setting the signals VCNTL and $VCNTL_1$ to the appropriate voltages. If the transistors happen to be n-channel depletion mode FETs, then $VCNTL_1$ is set to be equal to or slightly more positive than VREF to turn on FET 408, FET 412, FET 416 and FET 420, and VCNTL is set to be sufficiently more negative than VREF to turn off FET 406, FET 410, FET 414 and FET 418. The RF signal is routed to the high pass network 402 by the first SPDT switch. The second SPDT switch then receives the RF signal from the high pass network 402 and routes it to node 403. In the other of the two possible phase states the RF signal is routed through the low pass network 404. The first SPDT switch is set to have low loss between node 401 and the low pass network 404 and to have high isolation between node 401 and the high pass network 402. The second SPDT switch is set to have low loss between the low pass network 404 and node 403 and have high isolation between the high pass network 402 and node 403. This switch condition is established by turning off FET 408, FET 412, FET 416 and FET 420 and turning on FET 406, FET 410, FET 414 and FET 418. These FETs are turned on and off by setting the signals, VCNTL and $VCNTL_1$ to the appropriate voltages. Again, if the transistors happen to be n-channel depletion mode FETs, then $VCNTL_1$ is set to be sufficiently more negative than VREF to turn off FET 408, FET 412, FET 416 and FET 420, and VCNTL is set to be equal to or slightly more positive than VREF to turn on FET 406, FET 410, FET 414 and FET 418. The RF signal is routed to the low pass network 404 by the first SPDT switch. The second SPDT switch then receives the RF signal from the low pass network 404 and routes it to node 403.

FIGS. 5 and 6 depict alternative exemplary embodiments of transistor phase shifter 400 shown in FIG. 4. In FIG. 5, an exemplary transistor phase shifter 500 with three FET transistors 506, 508, and 510 is depicted. As noted above the transistor phase shifter 500 can function in the same manner as phase shifter 400 can except that it is used for lower bit applications. FIG. 6 depicts another exemplary embodiment of a phase shifter 600 with only a single FET transistor 606 which also can be used for lower bit applications. As a reference, FIGS. 5 and 6 also variously indicate the presence of VCNTL, VCNTL'(FIG. 5 only) VREF, RF1, and RF2 in this exemplary embodiment of the present invention.

The present invention has been described above with reference to various exemplary embodiments. However, those skilled in the art will recognize that changes and modifications may be made to the exemplary embodiments without departing from the scope of the present invention. For example, the various operational steps, as well as the components for carrying out the operational steps, may be implemented in alternate ways depending upon the particular application or in consideration of any number of cost functions associated with the operation of the system (e.g., various of the steps may be deleted, modified, or combined with other steps). Alternatively, additional steps (e.g., solder paste placement steps) may be added to illustrate alternate embodiments of the invention. In addition, the various circuit component systems disclosed herein may be modified or changed to accommodate additional phase shifter circuit components as may be desired. The changes and/or modifications described above are intended to be included within the scope of the present disclosure, as set forth in the following claims.

What is claimed is:

1. A method for a phase shifter with flexible control voltage comprising:
   placing a first single pole double throw switch in communication with a second single pole double throw switch via a low pass network;
   placing the first single pole double throw switch in communication with the second single pole double throw switch via a high pass network;
   receiving a first RF signal at a first input/output node associated with the first single pole double throw switch;
   providing low loss between the first input/output node and the high pass network;
   providing a high isolation between the first input/output node and the low pass network; and
   providing the first RF signal to the second single pole double throw switch via the high pass network for output at a second input/output node associated with the second single pole double throw switch, wherein a capacitor, in communication with at least one of the first single pole double throw switch and the second single pole double throw switch, is a series resonant capacitor.

2. The method according to claim 1, wherein the first single pole double throw switch and the second single pole double throw switch comprise field effect transistors.

3. The method according to claim 2, wherein the field effect transistors are depletion mode field effect transistors.

4. A method for a phase shifter with flexible control voltage comprising:
   placing a first single pole double throw switch comprising field effect transistors in communication with a second single pole double throw switch comprising field effect transistors via a low pass network, wherein the field effect transistors further comprise a dc reference voltage;
   placing the first single pole double throw switch in communication with the second single pole double throw switch via a high pass network;
   receiving a first RF signal at a first input/output node associated with the first single pole double throw switch;
   providing low loss between the first input/output node and the high pass network;
   providing a high isolation between the first input/output node and the low pass network; and
   providing the first RF signal to the second single pole double throw switch via the high pass network for output at a second input/output node associated with the second single pole double throw switch, wherein a capacitor, in communication with at least one of the first single pole double throw switch and the second single pole double throw switch, is a series resonant capacitor.

5. The method according to claim 4, wherein the dc reference voltage is floated and wherein the floated reference voltage may be varied to vary a voltage value required to activate and deactivate the first and second single pole double throw switches.

* * * * *